United States Patent
Takenaka (10) Patent No.: US 12,010,796 B2
(45) Date of Patent: Jun. 11, 2024

(54) WIRING SUBSTRATE AND METHOD FOR MANUFACTURING WIRING SUBSTRATE

(71) Applicant: IBIDEN CO., LTD., Gifu (JP)

(72) Inventor: Yoshinori Takenaka, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 6 days.

(21) Appl. No.: 17/752,916

(22) Filed: May 25, 2022

(65) Prior Publication Data

US 2022/0386461 A1    Dec. 1, 2022

(30) Foreign Application Priority Data

May 28, 2021   (JP) .................... 2021-090424

(51) Int. Cl.
  *H05K 1/11*   (2006.01)
  *H05K 1/02*   (2006.01)
  (Continued)

(52) U.S. Cl.
  CPC ........... *H05K 1/116* (2013.01); *H05K 1/0298* (2013.01); *H05K 1/0373* (2013.01);
  (Continued)

(58) Field of Classification Search
  CPC .... H05K 1/116; H05K 1/0298; H05K 1/0373; H05K 1/0271; H05K 2201/096;
  (Continued)

(56) References Cited

U.S. PATENT DOCUMENTS

| 9,877,387 | B2 | 1/2018 | Kajita et al. | |
| 2007/0082183 | A1* | 4/2007 | Murai | H05K 3/421 |
| | | | | 428/209 |
| 2019/0132962 | A1* | 5/2019 | Harazono | H05K 3/38 |

FOREIGN PATENT DOCUMENTS

| WO | WO-2010061434 A1 * | 6/2010 | ........... H05K 1/0204 |
| WO | WO 2014/157342 A1 | 10/2014 | |
| WO | WO-2015064668 A1 * | 5/2015 | ........... H05K 1/0306 |

OTHER PUBLICATIONS

WO-2010061434-A1 (Translation) (Year: 2023).*
WO-2015064668-A1 (Translation) (Year: 2023).*

* cited by examiner

*Primary Examiner* — Hoa C Nguyen
*Assistant Examiner* — John B Freal
(74) *Attorney, Agent, or Firm* — Oblon, McClelland, Maier & Neustadt, L.L.P.

(57) ABSTRACT

A wiring substrate includes an insulating layer including resin and filler particles, conductor layers including an upper-layer conductor layer and a lower-layer conductor layer such that the insulating layer is sandwiched between the upper-layer and lower-layer conductor layers, and a penetrating conductor formed in the insulating layer such that the penetrating conductor is penetrating through the insulating layer and connecting the upper-layer and lower-layer conductor layers. The penetrating conductor is formed such that the penetrating conductor has a first length which is the maximum width of the penetrating conductor in the direction orthogonal to the thickness direction of the wiring substrate and the first length is 25 μm or less, and the insulating layer is formed such that the maximum particle size of the filler particles in a region within the distance of 40% of the first length from the penetrating conductor is 20% or less of the first length.

17 Claims, 7 Drawing Sheets

(51) Int. Cl.
 *H05K 1/03* (2006.01)
 *H05K 3/40* (2006.01)
 *H05K 3/46* (2006.01)
(52) U.S. Cl.
 CPC ......... *H05K 3/4038* (2013.01); *H05K 3/4644* (2013.01); *H05K 2201/096* (2013.01); *H05K 2201/09827* (2013.01)
(58) Field of Classification Search
 CPC . H05K 2201/09827; H05K 2201/0154; H05K 2201/068
 See application file for complete search history.

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-090424, filed May 28, 2021, the entire contents of which are incorporated herein by reference.

BACKGROUND OF THE INVENTION

Field of the Invention

The present invention relates to a wiring substrate and a method for manufacturing the wiring substrate.

Description of Background Art

International Publication No. 2014/157342 describes a wiring substrate that includes a penetrating conductor. The penetrating conductor adheres to an inner wall of a through hole that penetrates an inorganic insulating layer and is connected to a conductive layer formed on the inorganic insulating layer. The inorganic insulating layer includes a first portion that includes inorganic insulating particles and a resin part, and the inorganic insulating particles are interposed between the first portion and the penetrating conductor. The entire contents of this publication are incorporated herein by reference.

SUMMARY OF THE INVENTION

According to one aspect of the present invention, a wiring substrate includes an insulating layer including resin and filler particles, conductor layers including an upper-layer conductor layer and a lower-layer conductor layer such that the insulating layer is sandwiched between the upper-layer conductor layer and the lower-layer conductor layer, and a penetrating conductor formed in the insulating layer such that the penetrating conductor is penetrating through the insulating layer and connecting the upper-layer conductor layer and the lower-layer conductor layer. The penetrating conductor is formed such that the penetrating conductor has a first length which is the maximum width of the penetrating conductor in the direction orthogonal to the thickness direction of the wiring substrate and that the first length is 25 µm or less, and the insulating layer is formed such that the maximum particle size of the filler particles in a region within the distance of 40% of the first length from the penetrating conductor is 20% or less of the first length.

According to another aspect of the present invention, a method for manufacturing a wiring substrate includes forming an insulating layer including resin and filler particles, forming conductor layers including an upper-layer conductor layer and a lower-layer conductor layer such that the insulating layer is sandwiched between the upper-layer conductor layer and the lower-layer conductor layer, and forming a penetrating conductor in the insulating layer such that the penetrating conductor is penetrating through the insulating layer and connecting the upper-layer conductor layer and the lower-layer conductor layer. The forming of the penetrating conductor includes forming the penetrating conductor such that the penetrating conductor has a first length which is the maximum width of the penetrating conductor in the direction orthogonal to the thickness direction of the wiring substrate and that the first length is 25 µm or less, the forming of the insulating layer includes forming a region of the insulating layer such that the region does not contain the filler particles having particle sizes exceeding 20% of the first length, and the forming of the penetrating conductor includes forming the penetrating conductor in the region of the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
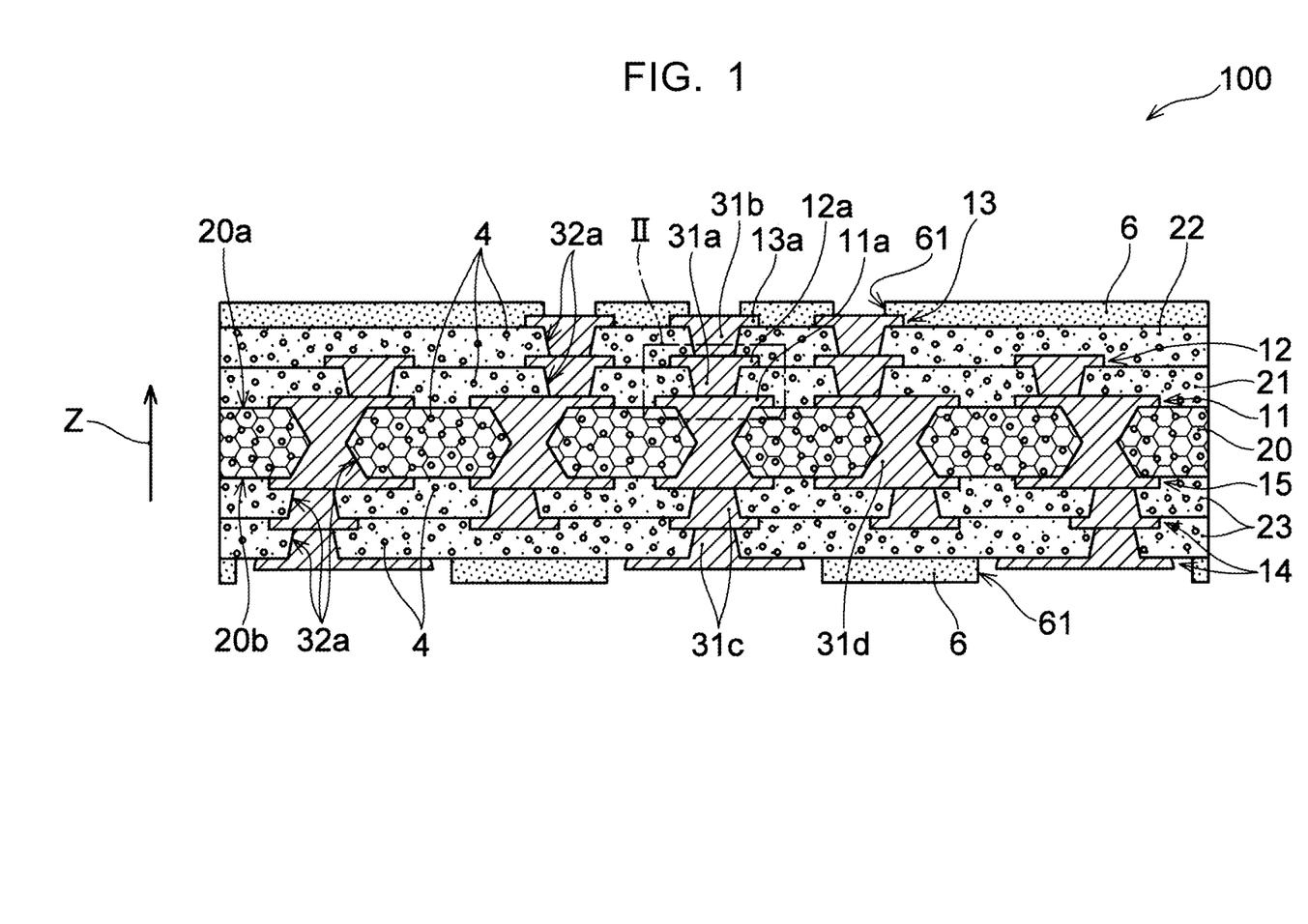
FIG. 1 is a cross-sectional view illustrating an example of a wiring substrate according to an embodiment of the present invention.
Figure 2:
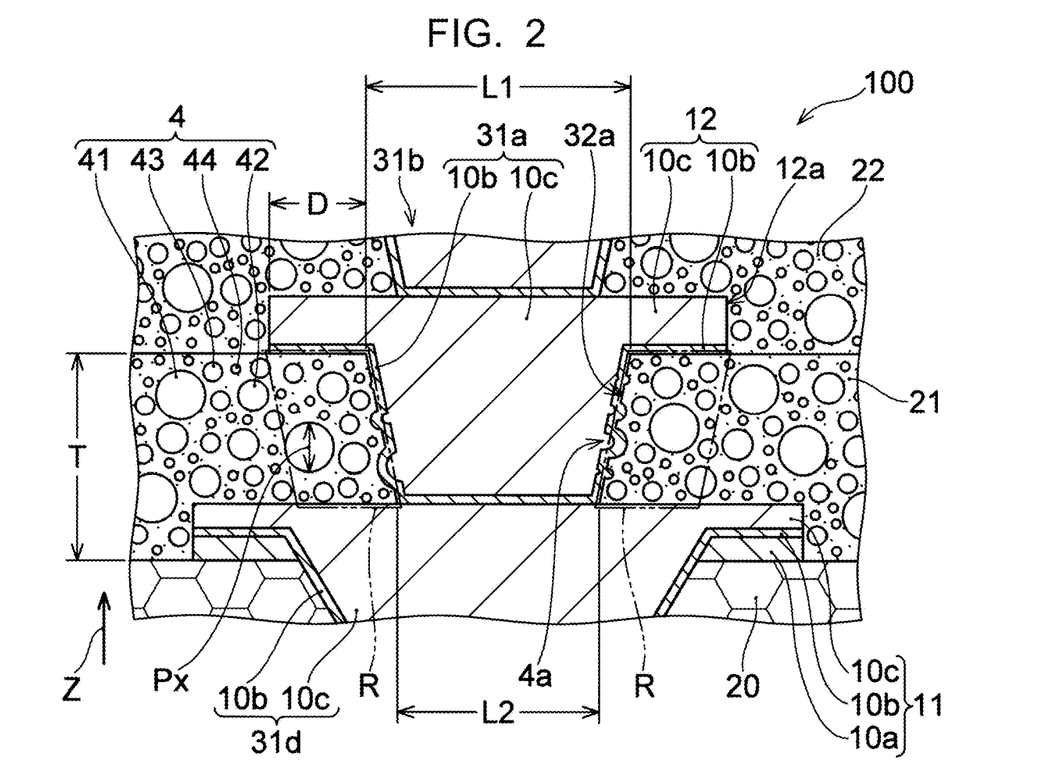
FIG. 2 is an enlarged view of a portion (II) of FIG. 1.
Figure 3:
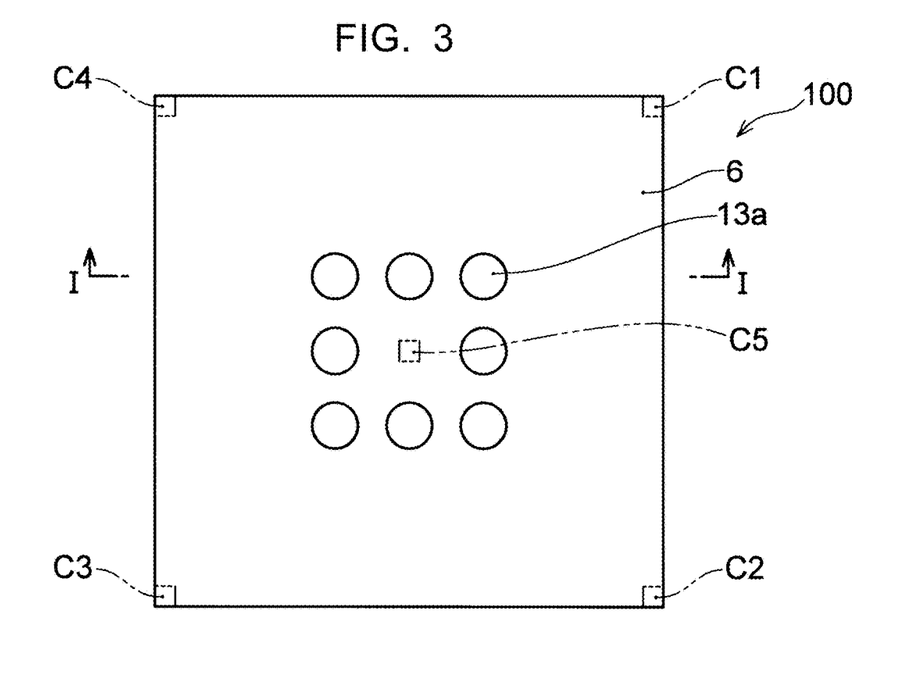
FIG. 3 is a plan view illustrating the wiring substrate illustrated in FIG. 1.

A wiring substrate according to an embodiment of the present invention is described with reference to the drawings. FIG. 1 illustrates a cross-sectional view of a wiring substrate 100, which is an example of a wiring substrate according to an embodiment of the present invention. FIG. 2 illustrates an enlarged view of a portion (II) of FIG. 1. Further, FIG. 3 illustrates an example of a plan view of the wiring substrate 100 of FIG. 1.

As illustrated in FIG. 1, the wiring substrate 100 includes an insulating layer 20, and conductor layers and insulating layers that are alternately laminated on both sides of the insulating layer 20. On a first surface (20a) of the insulating layer 20, sequentially from the first surface (20a) side, a conductor layer 11 (first conductor layer), an insulating layer 21 (first insulating layer), a conductor layer 12 (second conductor layer), an insulating layer 22 (second insulating layer), and a conductor layer 13 (third conductor layer) are laminated. On a second surface (20b) of the insulating layer 20, a conductor layer 15 is formed, and further two insulating layers 23 and two conductor layers 14 are alternately laminated. A core substrate of the wiring substrate 100 is formed by the insulating layer 20, the conductor layer 11, and the conductor layer 15. The conductor layers (11-14) and the insulating layers (21-23) are sequentially formed on both sides of the core substrate, and form build-up parts of the wiring substrate 100. The wiring substrate 100 illustrated in FIG. 1 is only an example of the wiring substrate of the present embodiment, and a wiring substrate of an embodiment may include any number of conductor layers and any number of insulating layers. Further, a wiring substrate of an embodiment may be a so-called coreless substrate having no core substrate.

In the above and following description, a side farther from the insulating layer 20 in a thickness direction of the wiring substrate 100 is also referred to as an "upper side" or simply "upper," and a side closer to the insulating layer 20 is also referred to as a "lower side" or simply "lower." For each of the structural elements of the wiring substrate 100, a surface facing the insulating layer 20 side is also referred to as a "lower surface" and a surface facing the opposite side with respect to the insulating layer 20 is also referred to as an "upper surface."

The insulating layer 21 is formed on the conductor layer 11 (which is formed on the first surface (20a) of the insulating layer 20), and on the upper surface (20a), and covers the conductor layer 11 and the upper surface (20a). The insulating layer 22 is formed on the conductor layer 12 (which is formed on the insulating layer 21) and on the insulating layer 21, and covers the conductor layer 12 and the insulating layer 21. The conductor layer 13 is formed on the insulating layer 22. The conductor layer 11 and the conductor layer 12 oppose each other with the insulating layer 21 sandwiched therebetween in a thickness direction of the insulating layer 21. With respect to the insulating layer 21, the conductor layer 11 is a lower-layer conductor layer of the conductor layer 12, and the conductor layer 12 is an upper-layer conductor layer of the conductor layer 11. Similarly, the conductor layer 12 and the conductor layer 13 oppose each other with the insulating layer 22 sandwiched therebetween in a thickness direction of the insulating layer 22. With respect to the insulating layer 22, the conductor layer 12 is a lower-layer conductor layer of the conductor layer 13, and the conductor layer 13 is an upper-layer conductor layer of the conductor layer 12. Further, also on the second surface (20b) side of the insulating layer 20, with respect to each insulating layer 23, a conductor layer (the conductor layer 14 or the conductor layer 15) on the insulating layer 20 side is a lower-layer conductor layer, and, with respect to each insulating layer 23, a conductor layer (the conductor layer 14) on the opposite side with respect to the insulating layer 20 is an upper-layer conductor layer. Further, with respect to the insulating layer 20, the conductor layer 11 and the conductor layer 15 oppose each other, and one of the conductor layer 11 and the conductor layer 15 is an upper-layer conductor layer and the other is a lower-layer conductor layer.

The wiring substrate 100 further includes penetrating conductors (31a-31d) that penetrate the insulating layers. The penetrating conductors (31a) penetrate the insulating layer 21 and connect the conductor layer 11 and the conductor layer 12 to each other. Similarly, the penetrating conductors (31b) penetrate the insulating layer 22 and connect the conductor layer 12 and the conductor layer 13 to each other. The penetrating conductors (31c) penetrate the insulating layers 23 and connect the conductor layer 14 and the conductor layer 15 to each other or connect the conductor layers 14 to each other. The penetrating conductors (31a-31c) are penetrating conductors formed in the insulating layers forming the build-up parts of the wiring substrate 100, and are so-called via conductors. On the other hand, the penetrating conductors (31d) connect the conductor layer 11 and the conductor layer 15 to each other. The penetrating conductors (31d) are penetrating conductors that penetrate the insulating layer 20 of the core substrate and connect the conductor layers on both sides of the insulating layer 20 to each other, and are so-called through-hole conductors.

The wiring substrate 100 of FIG. 1 further includes, on each of the first surface (20a) side and the second surface (20b) side of the insulating layer 20 of the wiring substrate 100, a solder resist layer 6 that covers the outermost conductor layer and insulating layer. In the solder resist layers 6, openings 61 are provided that each expose a part of the conductor layer 13 or the conductor layer 14. The solder resist layers 6 are formed, for example, using any insulating resin such as an epoxy resin or a polyimide resin.

The insulating layers (20-23) are each formed, for example, using an insulating resin such as an epoxy resin, a bismaleimide triazine resin (BT resin) or a phenol resin. Although not illustrated, the insulating layers may each contain a reinforcing material (core material) such as a glass fiber and/or inorganic filler such as silica.

Each of the insulating layers (20-23) contains multiple filler particles 4 in a granular form as a filler adjusting characteristics of the each of the insulating layers (20-23). Due to the filler particles 4, for each of the insulating layers (20-23), for example, thermal characteristics such as a thermal expansion coefficient and a thermal conductivity, and/or mechanical characteristics such as an elastic modulus and flexibility, and the like, can be adjusted. Examples of the multiple filler particles 4 include inorganic filler particles formed of particles of an inorganic substance such as silicon dioxide (silica, SiO2), alumina, or mullite. The multiple filler particles 4 may be organic filler particles formed of particles of an organic substance such as silicone or polyimide.

The conductor layers (11-15) and the penetrating conductors (31a-31d) are formed using any metal such as copper or nickel, and, for example, are each formed of a metal foil such as a copper foil and/or a metal film formed by plating or sputtering, or the like. Therefore, the conductor layers (11-15) and the penetrating conductors (31a-31d) can each have a multilayer structure including two or more metal layers. However, it is also possible that the conductor layers (11-15) and the penetrating conductors (31a-31d) each have a single-layer structure including only a single metal layer.

The conductor layers (11-15) are each patterned to predetermined conductor pads and/or wiring patterns. For example, the conductor layer 11, the conductor layer 12, and the conductor layer 13 respectively include conductor pads (11a), conductor pads (12a), and conductor pads (13a). The conductor pads (11a), the conductor pads (12a), and the conductor pads (13a) are respectively connected to the penetrating conductors (31d), the penetrating conductors (31a), and the penetrating conductors (31b). The conductor pads (11a), the conductor pads (12a), and the conductor pads (13a) are respectively integrally formed with the penetrating conductors (31d), the penetrating conductors (31a), and the penetrating conductors (31b). The conductor pads (11a) are so-called through-hole pads of the penetrating conductors (31d), and the conductor pads (12a) and conductor pads (13a) are respectively so-called via pads of the penetrating conductors (31a) and the penetrating conductors (31b). Due to the conductor pads, connection reliability between the penetrating conductors and the conductor layers is improved.

The conductor pads (11a) are further connected to the penetrating conductors (31a), and the conductor pads (12a) are further connected to the penetrating conductors (31b). The conductor pads (11a) and the conductor pads (12a) are respectively so-called receiving pads of the penetrating conductors (31a) and the penetrating conductors (31b). Due to the conductor pads (11a), the connection reliability between the penetrating conductors (31a) and the conductor layer 11 is improved, and due to the conductor pads (12a), the connection reliability between the penetrating conductors (31b) and the conductor layer 12 is improved.

The penetrating conductors (31a-31d) are respectively formed in through holes (32a), and extend along the thickness direction of the wiring substrate 100 (hereinafter, the thickness direction of the wiring substrate 100 and a direction parallel to the thickness direction of wiring substrate 100 are also simply referred to as "the Z direction"). The penetrating conductors (31a-31d) each have a "width" in a direction orthogonal to the Z-direction. The "width" of each of the penetrating conductors is a longest distance between any two points on an outer circumference of a cross section or an end face of the each of the penetrating conductors that is orthogonal to the Z direction. The cross section or end surface of each of the penetrating conductors can have any shape such as a circular shape or an elliptical shape. When the shape of the cross section or end surface of each of the penetrating conductors is a circular shape, an elliptical shape, or a rectangular shape, the "width" of the each of the penetrating conductors is a diameter, a major diameter, or a diagonal length. The width of each of the penetrating conductors (31a-31c) (which are so-called via conductors) is also referred to as a "via diameter," and the width of each of the penetrating conductors (31d) (which are so-called through-hole conductors) is also referred to as a "through-hole diameter."

Each of the penetrating conductors (31a-31d) may have a substantially constant width over its entire length in the Z direction (axial direction of each of the penetrating conductors). However, as in the example of FIG. 1, the penetrating conductors (31a-31d) may each have a width that varies depending on a position in the Z direction. A maximum width of each of the penetrating conductors is also referred to as a "first length" of the each of the penetrating conductors. In the example of FIG. 1, each of the penetrating conductors (31a-31d) has a tapered shape, and thus, has the maximum width at one end in the Z direction. Specifically, each of the penetrating conductors (31a-31c) has the maximum width at an end surface on the upper-layer conductor layer side with respect to the insulating layer that the each of the penetrating conductors (31a-31c) penetrates. Further, each of the penetrating conductors (31a-31c) has a minimum width at an end surface on the lower-layer conductor layer side with respect to the insulating layer that the each of the penetrating conductors (31a-31c) penetrates. Each of the penetrating conductors (31d) has a maximum width at both ends in the Z direction and a minimum width at a substantially central portion in the Z direction.

In the present embodiment, in at least one insulating layer of the one or more insulating layers (in the example of FIG. 1, the insulating layers (20-23)) of the wiring substrate 100, the penetrating conductors that penetrate the at least one insulating layer each have a maximum width (first length) of 25 μm or less, preferably, 20 μm or less. It is thought that this promotes miniaturization of the wiring substrate 100. In the example of FIG. 1, for example, one or more of the penetrating conductors (31a-31c) each have a maximum width of 25 μm or less.

In the wiring substrate 100 illustrated in FIGS. 1-3, as illustrated in FIG. 2, the conductor layer 11 has a three-layer structure including a metal foil (10a), a metal film (10b), and a plating film (10c). On the other hand, the conductor layer 12 and the penetrating conductors (31a, 31b, 31d) each have a two-layer structure including a metal film (10b) and a plating film (10c). Although not illustrated in the drawings, the conductor layer 15 can have the same three-layer structure as the conductor layer 11, the conductor layer 13 and the conductor layers 14 can have the same two-layer structure as the conductor layer 12, and the penetrating conductors (31c) can have the same two-layer structure as the penetrating conductors (31b). The metal foil (10a) is, for example, a copper foil or a nickel foil, and is formed on a surface of the insulating layer 20. The metal film (10b) is formed by electroless plating or sputtering on the metal foil (10a) or on a surface of an insulating layer. The plating film (10c) is formed, for example, by electrolytic plating using the metal film (10b) as a power feeding layer.

A relationship between the maximum width of each of the penetrating conductors and particle sizes of the filler particles 4 contained in each of the insulating layers in the present embodiment is further described using the insulating layer 21, the penetrating conductors (31a), and the conductor layer 12 (upper-layer conductor layer) and the conductor layer 11 (lower-layer conductor layer), which oppose each other with the insulating layer 21 sandwiched therebetween, as an example. FIG. 2 is mainly referenced. As illustrated in FIG. 2, each of the penetrating conductors (31a) has a first length (L1), which is the maximum width, at an interface with the conductor layer 12, which is one end on the conductor layer 12 side. Each of the penetrating conductors (31a) in the example of FIG. 2 has a first length (L1) of 25 μm or less. Each of the penetrating conductors (31a) has a second length (L2) as a width at the other end (an interface with the conductor layer 11) positioned on the opposite side with respect to the one end on the conductor layer 12 side.

As illustrated in FIG. 2, filler particles (41-44) among the multiple filler particles 4 contained in the insulating layer 21 have any particle sizes. A "particle size" of each of the multiple filler particles 4 is a longest distance between any two points on an outer surface of the each of the multiple filler particles 4.

In the present embodiment, the multiple filler particles 4 contained in an insulating layer penetrated by penetrating conductors having a first length (L1) of 25 μm or less, such as the insulating layer 21 illustrated in FIG. 2, include filler particles having particle sizes of 20% or less of the first length (L1). In the following, an "insulating layer penetrated by penetrating conductors having a first length (L1) of 25 μm or less" is also simply referred to as a "target insulating layer."

In the present embodiment, further, among the multiple filler particles 4 contained in a target insulating layer, at least filler particles that exist in regions within 40% of the first length (L1) from the penetrating conductors (the penetrating conductors (31a) in the example of FIG. 2) have a maximum particle size (Px) of 20% or less of the first length (L1). That is, a target insulating layer does not contain filler particles (41-44) having particle sizes exceeding 20% of the first length (L1) in regions within 40% of the first length (L1) from the penetrating conductors. The "regions within 40% of the first length (L1) from the penetrating conductors" are also simply referred to as "neighborhood regions (R)" of the penetrating conductors in the following.

Preferably, among the multiple filler particles 4 contained in a target insulating layer, at least filler particles that exist in regions within 60% of the first length (L1) from the penetrating conductors have a maximum particle size of 20% or less of the first length (L1). Further, preferably, among the multiple filler particles 4 contained in a target insulating layer, at least filler particles that exist in the neighborhood regions (R) of the penetrating conductors have a maximum particle size of 10% or less of the first length (L1). More preferably, among the multiple filler particles 4 contained in a target insulating layer, at least filler particles that exist in regions within 60% of the first length (L1) from the penetrating conductors may have a maximum particle size of 10% or less of the first length (L1).

In the present embodiment, in this way, in at least a target insulating layer, only filler particles (41-44) having relatively small particle sizes exist near the penetrating conductors such as the penetrating conductors (31a). Therefore, for example, in the insulating layer 21, the filler particles (41-44) are unlikely to protrude into the through holes (32a). Further, in a manufacturing process, even when some of the multiple filler particles 4 are once exposed on inner walls of the through holes (32a), the some of the multiple filler particles 4 are unlikely to remain until the penetrating conductors (31a) are formed. That is, as will be described later, in the formation of the penetrating conductors (31a), the through holes (32a) are formed in the insulating layer 21, and the penetrating conductors (31a) are formed in the through holes (32a), for example, by a plating treatment. Prior to the plating treatment, a chemical treatment such as desmear treatment is preferably performed. Resin residues generated during drilling of the through holes (32a) are removed by the desmear treatment. Even when exposed in the through holes (32a), filler particles (41-44) having relatively small particle sizes are peeled off by the desmear treatment. As a result, during plating for forming the penetrating conductors (31a), the through holes (32a) without the filler particles (41-44) protruding inward are obtained.

The larger the maximum width of the penetrating conductors (31a) is, that is, the larger an opening diameter of each of the through holes (32a) is, the easier it is for a chemical solution used in a desmear treatment or the like to enter the through holes (32a). Therefore, filler particles exposed in the through holes (32a) are easily peeled off. In other words, the smaller the maximum width of the penetrating conductors (31a) is, the lower is a peeling force due to a desmear treatment with respect to the filler particles exposed in the through holes (32a). However, it is thought that the filler particles (41-44) having particle sizes of 20% or less of the maximum width of the penetrating conductors (31a) can be sufficiently peeled off, for example, by a chemical treatment such as a desmear treatment.

When penetrating conductors are formed in through holes having filler particles such as the filler particles (41-44) protruding inward, as will be described in detail later with reference to FIG. 7, problems such as an increase in electrical resistance of the penetrating conductors and interfacial peeling due to insufficient adhesion strength between the insulating layer and the penetrating conductors may occur. Such problems are unlikely to manifest when the penetrating conductors are relatively large. However, when the penetrating conductors are small, since a cross-sectional area of each of the penetrating conductors or a contact area between the insulating layer and each of the penetrating conductors becomes small, a specific problem is likely to occur.

In the present embodiment, a target insulating layer includes penetrating conductors having a maximum width of 25 μm or less, and includes relatively small penetrating conductors. However, in the present embodiment, for example, only the filler particles (41-44) having particle sizes of 20% or less of the maximum width (first length (L1)) of the penetrating conductors (31a) exist in the neighborhood regions (R) of the penetrating conductors (31a). Therefore, the filler particles (41-44) are unlikely to protrude into the through holes (32a). For example, even when a variation of 100% in particle sizes of the filler particles (41-44) occurs, that is, even when there are filler particles (41-44) having particle sizes of up to 40% of the first length (L1), the filler particles (41-44) are unlikely to be exposed in the through holes (32a).

And, even when there are filler particles (41-44) exposed in the through holes (32a) immediately after the formation of the through holes (32a), the filler particles (41-44) having small particle sizes can be easily removed by a subsequent chemical treatment such as a desmear treatment. Also in the example of FIG. 2, on the inner walls of the through holes (32a), there are recesses (4a) formed of traces of some of the multiple filler particles 4 that are exposed on wall surfaces of the through holes (32a) and are then peeled off. In this way, even when the filler particles (41-44) are exposed in the through holes (32a), the filler particles can be easily removed, and thus, the penetrating conductors (31a) appropriately formed in the through holes (32a) can be obtained. It is thought that occurrence of problems such as an increase in electrical resistance of the penetrating conductors (31a) and peeling between the insulating layer 21 and the penetrating conductors (31a) are suppressed.

Further, since there are no filler particles (41-44) having large particle sizes near the penetrating conductors (31a), it is thought that undulation of the inner wall surfaces of the through holes (32a) caused by a difference in thermal expansion coefficient between the filler particles (41-44) and a surrounding resin material is unlikely to occur. Also from this point, it is thought that peeling between the insulating layer 21 and the penetrating conductors (31a) is suppressed.

In the present embodiment, the maximum particle size of all particle sizes of the multiple filler particles 4 contained in a target insulating layer may be 20% or less of the first length (L1), or may be 10% or less of the first length (L1). That is, it is possible that a target insulating layer does not contain filler particles having particle sizes exceeding 20% of the first length (L1), or further, does not contain filler particles having particle sizes exceeding 10% of the first length (L1), over the entire target insulating layer. In this case, the maximum particle size (Px) of multiple filler particles 4 existing in the neighborhood regions (R) is substantially certainly 20% or less of the first length (L1), and the filler particles (41-44) can be more reliably prevented from protruding into the through holes (32*a*).

In the present embodiment, in this way, since there are no filler particles having relatively large particle sizes in the neighborhood regions (R) of the penetrating conductors, interfaces that are between the insulating layer and the penetrating conductors and at which filler particles do not exist are likely to be obtained. Also in the example of FIG. 2, the multiple filler particles 4 do not exist at the interfaces between the insulating layer 21 and the penetrating conductors (31*a*). That is, interfaces of the insulating layer 21 with the penetrating conductors (31*a*) are formed of structural elements other than the multiple filler particles 4, for example, are formed of a resin component such as an epoxy resin or a BT resin. Therefore, it is thought that problems such as an increase in electrical resistance of the penetrating conductors (31*a*) and peeling between the penetrating conductors (31*a*) and the insulating layer 21 are unlikely to occur.

In the example of FIG. 2, the second length (L2) as a width of each of the penetrating conductors (31*a*) at an interface with the conductor layer 11 is shorter than the first length (L1). For example, the second length (L2) is 50% or more and 80% or less of the first length (L1). The maximum particle size of all particle sizes of the multiple filler particles 4 may be 20% or less of the second length (L2), which is shorter than the first length (L1). It is thought that the filler particles (41-44) can be more reliably prevented from protruding into the through holes (32*a*).

In the present embodiment, a content rate of the multiple filler 4 in a target insulating layer is not particularly limited, and can be selected according to characteristics desired for the target insulating layer. For example, a volume content rate of the multiple filler 4 in a target insulating layer is 30% or more and 80% or less. It is thought that, when the multiple filler particles 4 are contained in a target insulating layer at a content rate in this range, protrusion of the filler particles (41-44) into the through holes (32*a*) can be suppressed while desired characteristics requiring a relatively high content rate can be achieved.

In the example of FIG. 2, the maximum particle size (Px) of the multiple filler particles 4 is 20% or more and 40% or less of a thickness (T) of the insulating layer 21. The thickness (T) of the insulating layer 21 is 50% or more and 100% or less of the first length (L1). It is thought that, when the maximum particle size (Px) of the multiple filler particles 4 is 40% or less of the thickness (T) of the insulating layer 21, undulation at an interface between the insulating layer 21 and the conductor layer 11 or the conductor layer 12 due to a difference in thermal expansion coefficient between filler particles (41-44) and the surrounding resin material is unlikely to occur. Further, it is thought that the penetrating conductors (31*a*) having the first length (L1) are easily and appropriately formed in the insulating layer 21 having the thickness (T) of 50% or more and 100% or less of the first length (L1). As illustrated by the thickness (T) in FIG. 2, a thickness of a target insulating layer is a distance between the conductor layers sandwiching the target insulating layer.

In the example of FIG. 2, the conductor pads (12*a*) each have an area larger than an area of an interface between the conductor layer 12 and each of the penetrating conductors (31*a*). And, the maximum particle size (Px) of the multiple filler particles 4 existing in regions overlapping the conductor pads (12*a*) in a plan view is larger than a distance (D) from an outer edge of a conductor pad (12*a*) to an outer edge of a penetrating conductor (31*a*) in a plan view. The term "plan view" means viewing a wiring substrate according to an embodiment of the present invention along the Z direction. That is, the maximum particle size (Px) of the particle sizes of the filler particles (41-44) at least partially covered by the conductor pads (12*a*) is smaller than the distance (D). In this way, the maximum particle size (Px) of the multiple filler particles 4 at least partially covered in a plan view by the conductor pads integrally formed with the penetrating conductors penetrating the target insulating layer may be smaller than a so-called annular ring width of the conductor pads. It is thought that influence on flatness of interfaces between conductor pads such as the conductor pads (12*a*) and the target insulating layer due to expansion of contraction of the multiple filler particles 4 is small. The distance (D) is a design value of an annular ring width of conductor pads (via pads or through-hole pads) such as the conductor pads (12*a*).

In the wiring substrate of the present embodiment, variation in particle sizes of the multiple filler particles 4 in a target insulating layer between any regions in a plan view is preferably small. A reason for this is that, when the variation is small, appropriateness of the maximum particle size of the multiple filler particles 4 in the neighborhood regions (R) of the penetrating conductors can be confirmed with sufficient reliability with a sampling inspection of a small number of places.

For example, variation in maximum particle size of the multiple filler particles 4 between a corner (C1), a corner (C2), a corner (C3), a corner (C4), and a center part (C5) illustrated in the plan view of the wiring substrate 100 illustrated in FIG. 3 is preferably 5% or less of the first length (L1) of the penetrating conductors penetrating the target insulating layer. When the variation in maximum particle size of the multiple filler particles 4 is about this level, it is thought that the appropriateness of the particle sizes of the multiple filler particles with respect to the width of each of the penetrating conductors penetrating the target insulating layer can be confirmed by sampling inspection at a small number of places throughout the target insulating layer without using an excessively strict determination threshold.

The corners (C1-C4) and the center part (C5) in FIG. 3 each illustrate in a plan view a unit cube with the thickness (for example, the thickness (T) illustrated in FIG. 2) of the target insulating layer as a length of one side. The variation in particle sizes of the multiple filler particles contained in the target insulating layer may be substituted and confirmed using variation in maximum particle sizes of filler particles in the unit cubes that are respectively defined by the four corners and the center of the target insulating layer as illustrated in FIG. 3.

Figure 4:
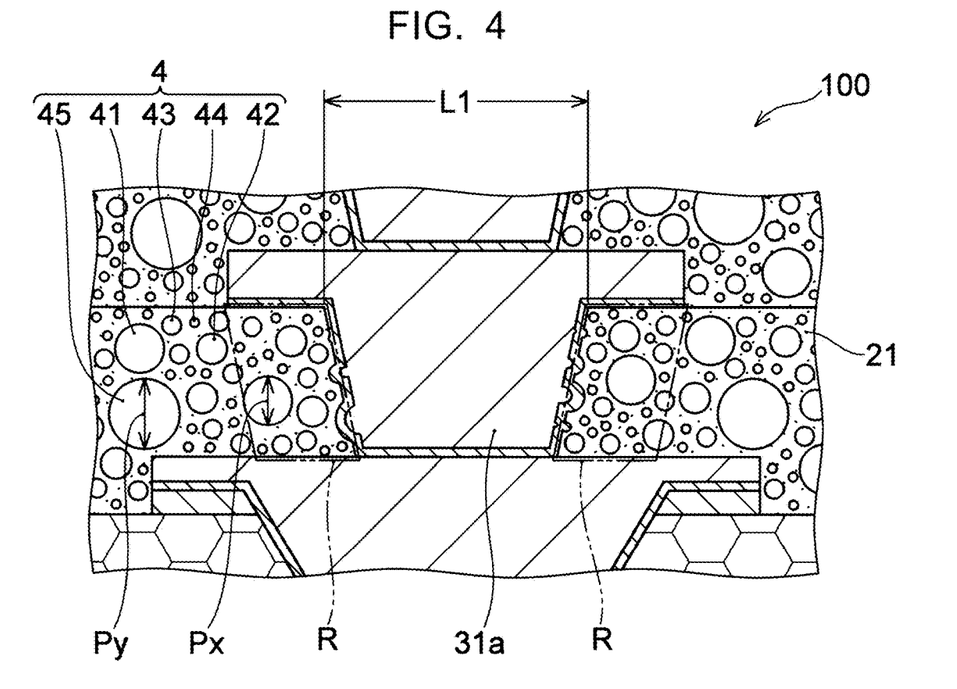
FIG. 4 is a cross-sectional view illustrating another example of a wiring substrate according to an embodiment of the present invention.

FIG. 4 illustrates another example of the wiring substrate 100 of FIG. 1. FIG. 4 illustrates a cross-sectional view of a portion corresponding to the portion illustrated in FIG. 2 in another example of the wiring substrate 100. As described above, in the wiring substrate 100 of the embodiment, among the multiple filler particles 4 contained in the target insulating layer, at least filler particles that exist in the neighborhood regions (R) have a maximum particle size (Px) of 20% or less of the first length (L1). In other words, outside the neighborhood regions (R), the target insulating layer may contain filler particles having particle sizes exceeding 20% of the first length (L1). In the other example of the wiring substrate 100 of the embodiment illustrated in FIG. 4, the insulating layer 21 contains multiple filler particles 4 including filler particles (41-45), and the filler particles 45 having particle sizes (Py) exceeding 20% of the first length (L1) are contained in regions outside the neighborhood regions (R). It is thought that even when the filler particles 45 having relatively large particle sizes exist at positions farther away from the penetrating conductor 31 than the neighborhood regions (R), filler particles protruding into the through holes (32*a*) are unlikely to occur. Therefore, in the wiring substrate 100 of the embodiment, a target insulating layer may contain filler particles having particle sizes exceeding 20% of the first length (L1) in regions outside the neighboring regions (R).

The description given with reference to FIGS. 2 and 4 can also be applied to the insulating layer 22, the conductor layer 12, the conductor layer 13, and the penetrating conductors (31*b*) by respectively reading the insulating layer 21, the conductor layer 11, the conductor layer 12, and the penetrating conductors (31*a*) as the insulating layer 22, the conductor layer 12, the conductor layer 13, and the penetrating conductors (31*b*). Similarly, the description given with reference to FIGS. 2 and 4 can be applied to the insulating layers, the conductor layers, and the penetrating conductors on the second surface (20*b*) side of the insulating layer 20.

Next, a method for manufacturing the wiring substrate according to an embodiment of the present invention is described with reference to FIGS. 5A-5H using the wiring substrate 100 of FIG. 1 as an example.

Figure 5A:
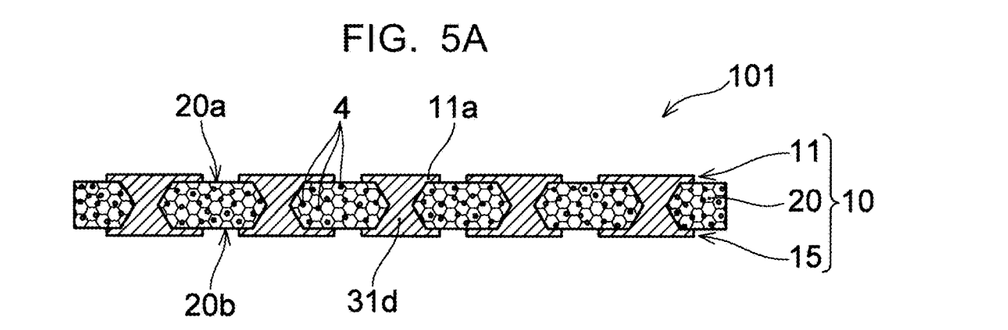
FIG. 5A is a cross-sectional view illustrating an example of a manufacturing process of a wiring substrate according to an embodiment of the present invention.

As illustrated in FIG. 5A, a core substrate 10 is prepared. For example, a double-sided copper-clad laminated plate 101 including the insulating layer 20 that contains multiple filler particles 4 and on both sides of which a metal foil (not illustrated in the drawings) is laminated is prepared, and the conductor layer 11 is formed on the first surface (20*a*) of the insulating layer 20 and the conductor layer 15 is formed on the second surface (20*b*) of the insulating layer 20. The penetrating conductors (31*d*) are formed in the insulating layer 20. For example, the conductor layers (11, 15) and the penetrating conductors (31*d*) are formed using a subtractive method including panel plating. The conductor layer 11 and the conductor layer 15 are patterned to include predetermined conductor patterns such as the conductor pads (11*a*) of the conductor layer 11.

Figure 5B:
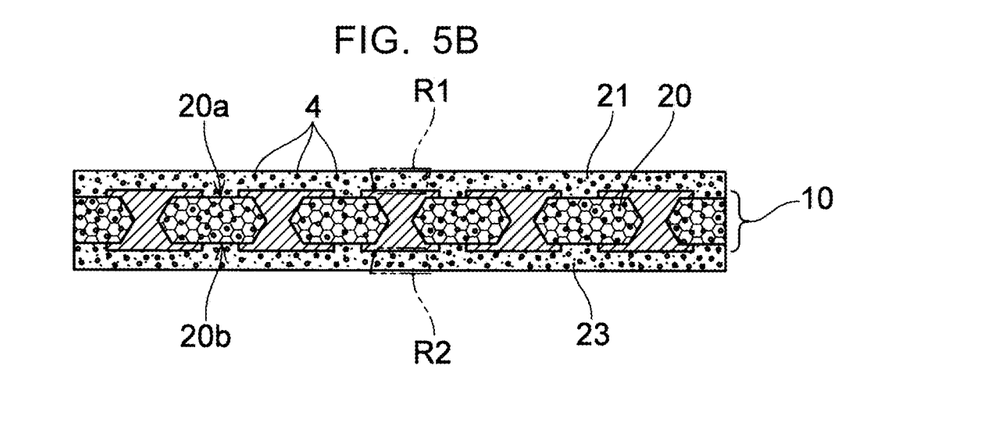
FIG. 5B is a cross-sectional view illustrating an example of a manufacturing process of a wiring substrate according to an embodiment of the present invention.

As illustrated in FIG. 5B, the method for manufacturing the wiring substrate of the present embodiment includes forming the insulating layer 21 containing multiple granular filler particles 4. In the example of FIG. 5B, the insulating layer 21 is formed on the first surface (20*a*) of the insulating layer 20. Similar to the insulating layer 21, the insulating layer 23 containing multiple granular filler particles 4 is formed on the second surface (20*b*) of the insulating layer 20. For example, a film-like epoxy resin containing multiple filler particles 4 is laminated on each of both sides of the core substrate 10 and is heated and pressed. As a result, the insulating layer 21 and the insulating layer 23 are formed. The insulating layer 21 and the insulating layer 23 can be formed using any resin such as a BT resin or a phenol resin without being limited to using a film-like epoxy resin.

The insulating layer 21 is formed so as to have regions (R1) in which the multiple filler particles 4 do not include filler particles having particle sizes exceeding 20% of a predetermined length. The "predetermined length" is a maximum value (maximum width) of widths the penetrating conductors (31*a*) (see FIG. 5G) to be formed in a subsequent process, the widths being along a direction orthogonal to the thickness direction of the insulating layer 21. For example, the insulating layer 21 is formed using a resin containing multiple filler particles 4 that do not include filler particles having particle sizes exceeding 20% of the predetermined length. In this case, the regions (R1) that do not contain filler particles having particle sizes exceeding 20% of the predetermined length can be easily provided in the insulating layer 21. A resin containing multiple filler particles 4 that do not include filler particles having particle sizes exceeding 20% of the predetermined length may be any resin such as epoxy resin, a BT resin, or a phenol resin molded into a film-like shape as described above, or may be molded into a sheet-like shape.

The insulating layer 23 also may be formed so as to include regions (R2) in which the multiple filler particles 4 do not include filler particles having particle sizes exceeding 20% of a maximum width of the penetrating conductors (31*c*) (see FIG. 5G) to be formed in a subsequent process, the maximum width being along a direction orthogonal to the thickness direction of the insulating layer 23.

Figure 5C:
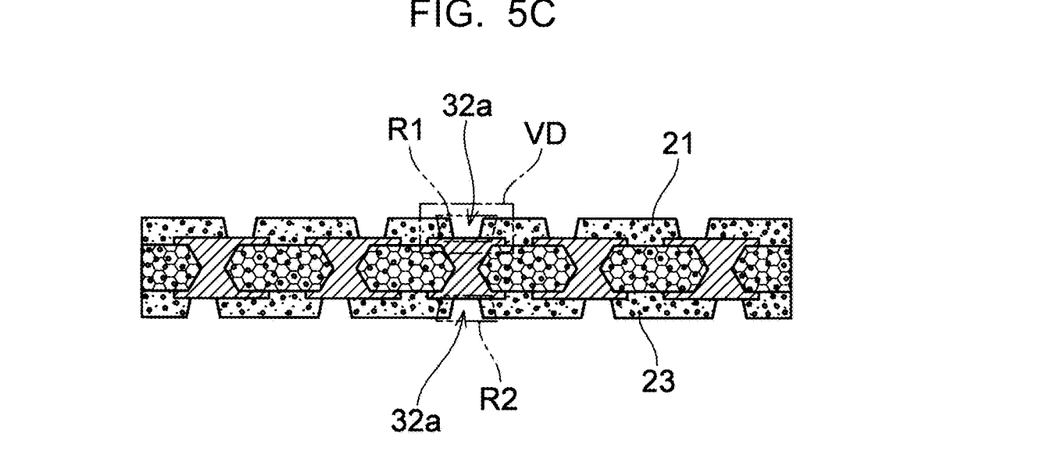
FIG. 5C is a cross-sectional view illustrating an example of a manufacturing process of a wiring substrate according to an embodiment of the present invention.

As illustrated in FIG. 5C, the through holes (32*a*) penetrating the insulating layer 21 or the insulating layer 23 in the thickness direction are formed in the insulating layer 21 or the insulating layer 23. The through holes (32*a*) are formed, for example, by irradiation with $CO_2$ laser. The through holes (32*a*) are formed for forming the penetrating conductors (31*a*) or the penetrating conductors (31*c*) (see FIG. 5G). The through holes (32*a*) penetrating the insulating layer 21 are formed in the regions (R1). In the example of FIG. 5C, the through holes (32*a*) penetrating the insulating layer 23 are formed in the regions (R2). Therefore, filler particles having particle sizes larger than a certain size with respect to the opening diameter of each of the through holes (32*a*) (sizes exceeding 20% of the "predetermined length" described above) are unlikely to be exposed in the through holes (32*a*).

Figure 5D:
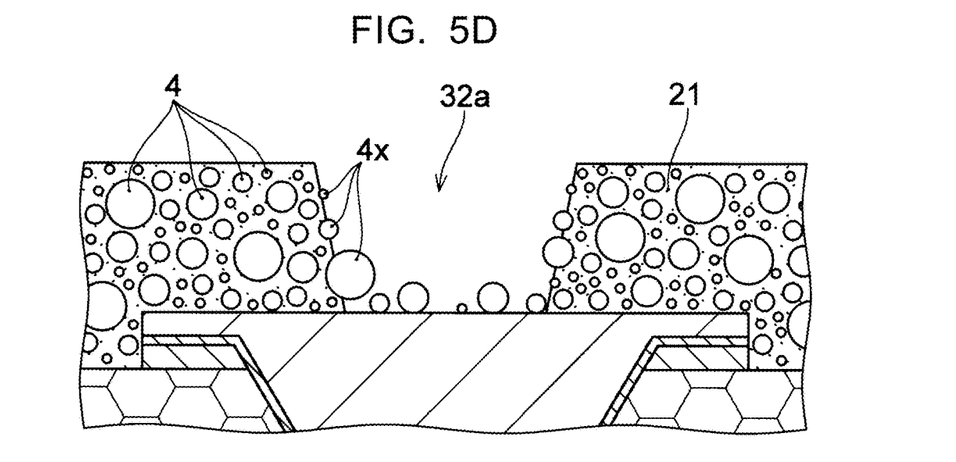
FIG. 5D is a cross-sectional view illustrating an example of a manufacturing process of a wiring substrate according to an embodiment of the present invention.

FIG. 5D illustrates an enlarged view of a portion (VD) of FIG. 5C (FIGS. 5E and 5F to be referenced later also each illustrate a state of the portion (VD) of FIG. 5C after a process). As illustrated in FIG. 5D, some filler particles (4*x*) having relatively small particle sizes among the multiple filler particles 4 may be exposed in the through holes (32*a*). Preferably, the filler particles (4*x*) exposed in the through holes (32*a*) are removed. For example, a desmear treatment is performed in which the inner walls of the through holes (32*a*) are exposed to a processing liquid such as an alkaline permanganate solution. Due to the desmear treatment, the filler particles (4*x*) exposed in the through holes (32*a*) are removed along with resin residues (smears) generated during the formation of the through holes (32*a*). Since only filler particles having relatively small particle sizes exist around the through holes (32*a*), the filler particles (4*x*) exposed in the through holes (32*a*) can be easily removed.

Figure 5E:
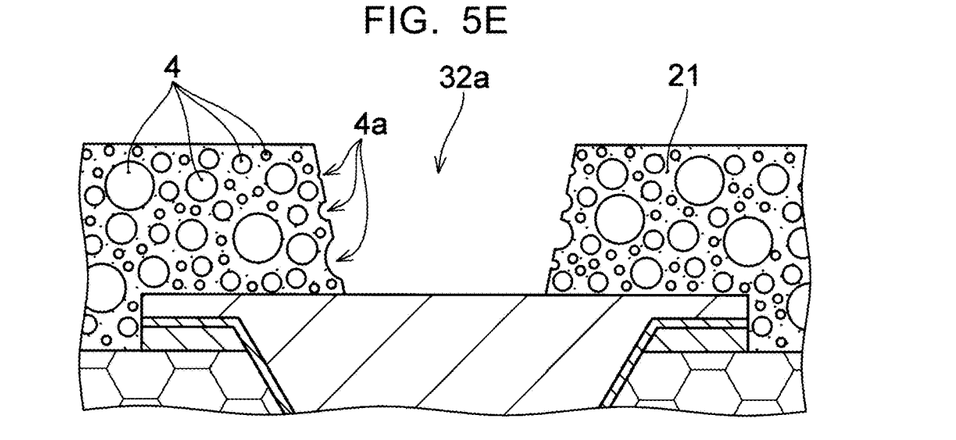
FIG. 5E is a cross-sectional view illustrating an example of a manufacturing process of a wiring substrate according to an embodiment of the present invention.

FIG. 5E illustrates the through holes (32*a*) after the desmear treatment. As illustrated in FIG. 5E, recesses (4*a*) formed of traces of peeled filler particles are formed on the inner walls of the through holes (32*a*). In this way, even when some filler particles having small particle sizes among the multiple filler particles 4 are once exposed in the through holes (32*a*), since the filler particles having small particle sizes are easily peeled off and easily removed, filler particles are unlikely to remain in the through holes (32*a*). Therefore, the penetrating conductors (31*a*) (see FIG. 5G) can be appropriately formed in a subsequent process.

Figure 5F:
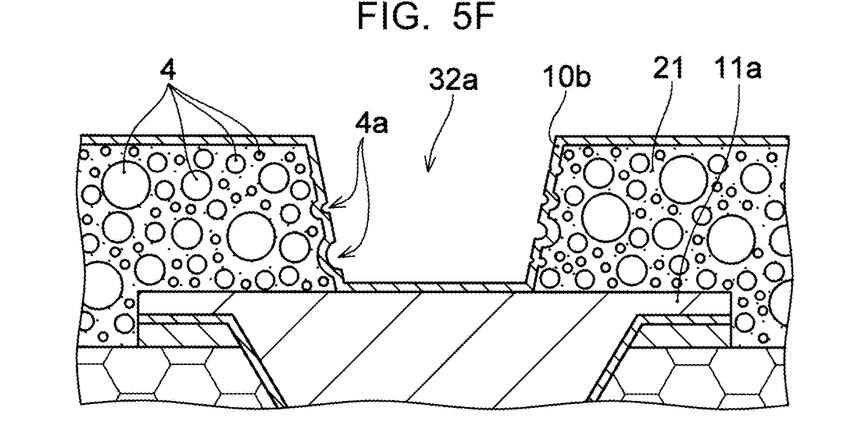
FIG. 5F is a cross-sectional view illustrating an example of a manufacturing process of a wiring substrate according to an embodiment of the present invention.

As illustrated in FIG. 5F, the metal film (10*b*) is formed, for example, by electroless plating or sputtering or the like on the surface of the insulating layer 21, on the inner walls of the through holes (32*a*), and on the conductor pads (11*a*) exposed in the through holes (32*a*). In the example of FIG. 5F, the metal film (10*b*) is also formed in the recesses (4*a*) on the inner walls of the through holes (32*a*). Filler particles that protrude from the inner walls of the through holes (32*a*) into the through holes (32*a*) are unlikely to exist among the multiple filler particles 4, and actually do not exist in the example of FIG. 5F. Therefore, non-deposition places or the like of a plating metal or the like are unlikely to occur on the inner walls of the through holes (32a). Therefore, it is thought that a deposition-failure portion of the metal film (10b) is unlikely to occur.

Figure 5G:
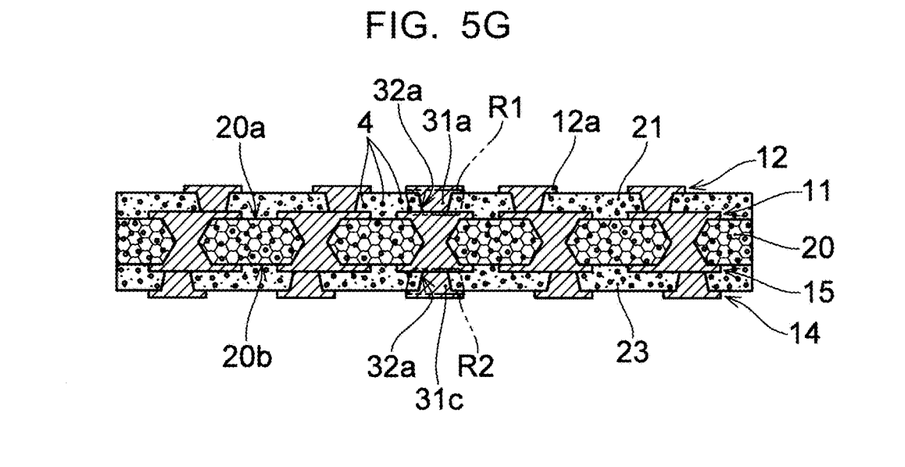
FIG. 5G is a cross-sectional view illustrating an example of a manufacturing process of a wiring substrate according to an embodiment of the present invention.

As illustrated in FIG. 5G, the conductor layer 12 is formed on the insulating layer 21, and the penetrating conductors (31a) are formed in the through holes (32a). The conductor layer 12 and the conductor layer 11 are connected to each other by the penetrating conductors (31a). On the second surface (20b) side of the insulating layer 20, the conductor layer 14 is formed on the insulating layer 23, and the penetrating conductors (31c) that connect the conductor layer 14 and the conductor layer 15 to each other are formed. In this way, the method for manufacturing the wiring substrate of the present embodiment includes forming two conductor layers (the conductor layers (11, 12, 14, 15)) that oppose each other with an insulating layer (the insulating layers (21, 23)) containing multiple filler particles 4 sandwiched therebetween. Further, the method for manufacturing the wiring substrate of the present embodiment includes forming penetrating conductors (the penetrating conductors (31a, 31c)) that penetrate an insulating layer containing multiple filler particles 4 and connect two conductor layers sandwiching the insulating layer to each other.

Further, forming the penetrating conductors (31a) can include, as described above, forming the through holes (32a) that penetrate the insulating layer 21 in the thickness direction, and removing filler particles that are among the multiple filler particles 4 and are exposed on the inner wall surfaces of the through holes (32a). Similarly, forming the penetrating conductors (31c) also can include forming the through holes (32a) that penetrate the insulating layer 23 in the thickness direction, and removing filler particles that are among the multiple filler particles 4 and are exposed on the inner wall surfaces of the through holes (32a).

The penetrating conductors (31a) are formed so as to have a maximum width of 25 μm or less, preferably 20 μm or less along a direction orthogonal to the thickness direction of the insulating layer 21. It may be possible that wiring patterns formed at fine pitches can be formed in the conductor layer 12 and the conductor layer 11. Similarly, the penetrating conductors (31c) are also formed so as to have a maximum width of 25 μm or less, preferably 20 μm or less along a direction orthogonal to the thickness direction of the insulating layer 23.

The penetrating conductors (31a, 31c) are formed in the through holes (32a). The through holes (32a) that penetrate the insulating layer 21 are formed in the regions (R1) that do not contain filler particles having particle sizes exceeding 20% of the maximum width of the penetrating conductors (31a). Therefore, the penetrating conductors (31a) are also formed in the regions (R1). Since the penetrating conductors (31a) are formed in the regions (R1), filler particles that are among the multiple filler particles 4 and have relatively large particle sizes are unlikely to protrude into the penetrating conductors (31a). In the example of FIG. 5G, the penetrating conductors (31c) are also formed in the regions (R2) that do not contain filler particles having particle sizes exceeding 20% of the maximum width of the penetrating conductors (31c). It is thought that protrusion of filler particles into the penetrating conductors (31c) is suppressed.

The penetrating conductors (31a) are preferably formed so as to respectively have spacings each exceeding 40% of the maximum width of the penetrating conductors (31a) with respect to outer edges of the regions (R1). In other words, the insulating layer 21 is preferably formed so as to ensure spacings each exceeding 40% of the maximum width of the penetrating conductors (31a) between the outer edges of the regions (R1) and the penetrating conductors (31a) to be formed in a subsequent process. It is thought that, by ensuring such spacings, even when there is variation in the opening diameters of the through holes (32a), and/or even when there is variation in the particle sizes of the multiple filler particles 4, filler particles having relatively large particle sizes are unlikely to be exposed in the through holes (32a). As a result, it is thought that protrusion of filler particles into the penetrating conductors (31a) is suppressed. The penetrating conductors (31c) are also preferably formed so as to respectively have spacings each exceeding 40% of the maximum width of the penetrating conductors (31c) with respect to outer edges of the regions (R2).

The conductor layers (12, 14) and the penetrating conductors (31a, 31c) are formed, for example, by pattern plating using electrolytic plating. The conductor layers (12, 14) are patterned to include predetermined conductor patterns such as the conductor pads (12a) by removing unwanted portions of the metal film (10b) (see FIG. 5F) described above. That is, in the example of FIGS. 5F and 5G, the conductor layers (12, 14) and the penetrating conductors (31a, 31c) are formed using a semi-additive method including the formation of the metal film (10b). As described above, during the formation of the metal film (10b), multiple filler particles 4 protruding into the through holes (32a) are unlikely to exist. Therefore, it is thought that the penetrating conductors (31a, 31c) are formed that have few deposition-failure portions on the inner walls of the through holes (32a) and for which interfacial peeling with the inner walls of the through holes (32a) is unlikely to occur.

Figure 5H:
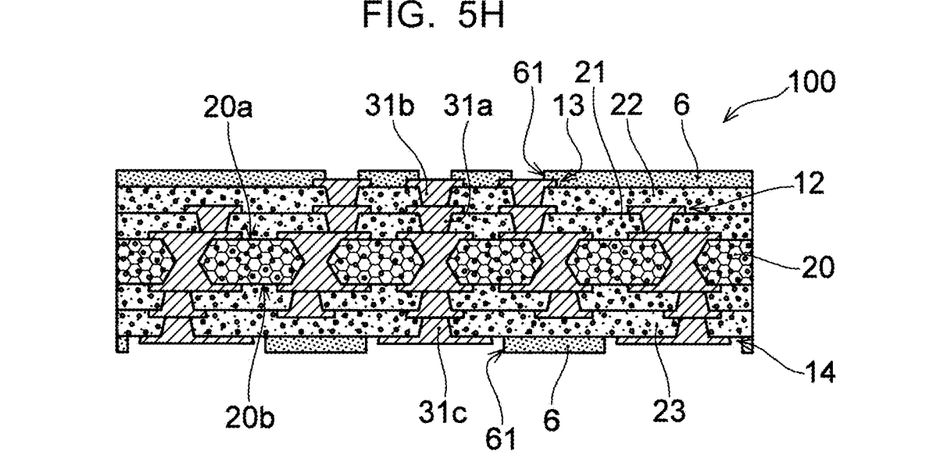
FIG. 5H is a cross-sectional view illustrating an example of a manufacturing process of a wiring substrate according to an embodiment of the present invention.

As illustrated in FIG. 5H, further, the insulating layer 22, the conductor layer 13, and the penetrating conductors (31b) are formed, and on the second surface (20b) side of the insulating layer 20, further, the insulating layer 23, the conductor layer 14, and the penetrating conductors (31c) are formed. The insulating layer 22 and the further formed insulating layer 23 are each formed, for example, using the same method as the method for forming the insulating layer 21. The conductor layer 13 and the further formed conductor layer 14 are each formed, for example, using the same method as the method for forming the conductor layer 12. Further, the penetrating conductors (31b) and the further formed penetrating conductors (31c) are each formed, for example, using the same method as the method for forming the penetrating conductors (31a). Therefore, also for the penetrating conductors (31b) and the further formed penetrating conductors (31c), protrusion of filler particles into the penetrating conductors is suppressed.

In the example of FIG. 5H in which the wiring substrate 100 of FIG. 1 is manufactured, the solder resist layers 6 are formed. In the solder resist layers 6, the openings 61 are provided that each exposes a part of the conductor layer 13 or the conductor layer 14. The solder resist layers 6 and the openings 61 are formed by, for example, forming a resin layer containing a photosensitive epoxy resin or polyimide resin or the like, and performing exposure and development using a mask having appropriate opening patterns.

Through the above processes, the wiring substrate 100 in the example of FIG. 1 is completed. A surface protective film (not illustrated in the drawings) may be formed on a surface of a part of the conductor layer 13 or the conductor layer 14 exposed in each of the openings 61 of the solder resist layers 6 by electroless plating, solder leveling, spray coating, or the like.

Figure 6A:
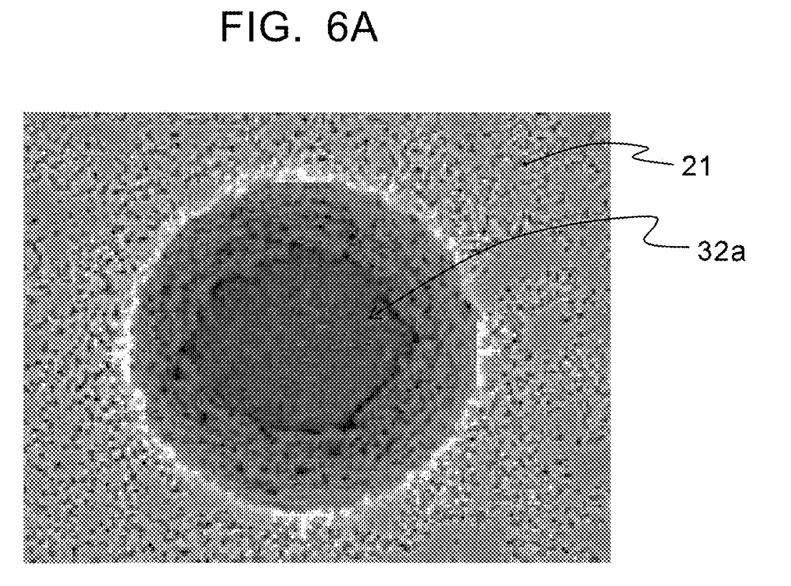
FIG. 6A is an SEM image of a through hole for forming a penetrating conductor in an example according to an embodiment of the present invention.
Figure 6B:
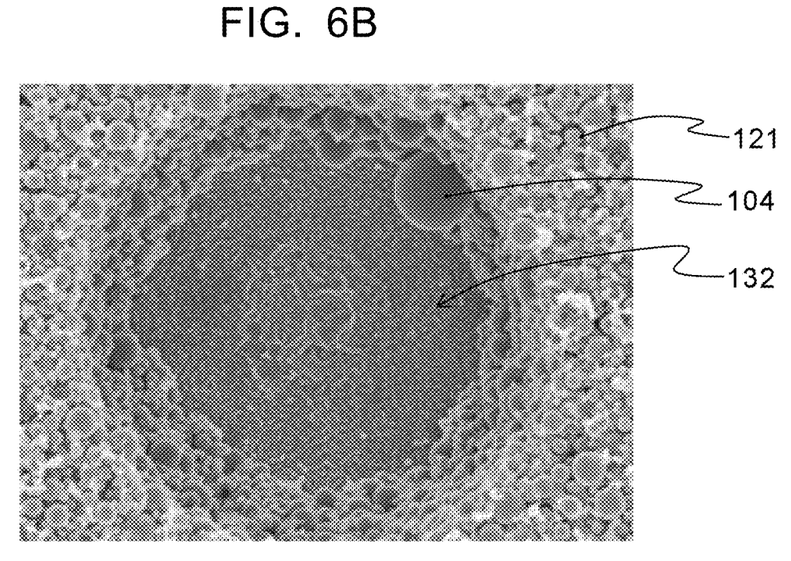
FIG. 6B is an SEM image of a through hole for forming a penetrating conductor in a comparative example for the present invention.

FIG. 6A shows a plan-view SEM image of a through hole (32a) after the desmear treatment illustrated in FIG. 5E referenced above in a working example of a method for producing a wiring substrate according to an embodiment of the present invention. FIG. 6B shows a plan-view SEM image of a through hole (132) after a desmear treatment in a comparative example with respect to the working example of FIG. 6A.

In the working example shown in FIG. 6A, a through hole (32a) having an opening diameter of 10 μm for forming a penetrating conductor having a maximum width of 10 μm is formed in an insulating layer 21 containing multiple filler particles having a maximum particle size of 1 μm. That is, the maximum particle size of the multiple filler particles is about 10% of the maximum width of the penetrating conductor. On the other hand, in the comparative example of FIG. 6B, a through hole 132 having an opening diameter of 15 μm for forming a penetrating conductor having a maximum width of 15 μm is formed in an insulating layer 121 containing multiple filler particles having a maximum particle size of 5 μm. That is, the maximum particle size of the multiple filler particles is about 33% of the maximum width of the penetrating conductor.

As shown in FIG. 6A, in the working example, no filler particle is exposed in the through hole (32a). On the other hand, in the comparative example of FIG. 6B, a filler particle 104 is exposed in the through hole 132, and the filler particle 104 protrudes from an inner wall of the through hole 132. It is clear from the working example and the comparative example shown in FIGS. 6A and 6B, by at least not containing filler particles having particle sizes of 30% or more of the width (maximum width) of the penetrating conductor in the insulating layer, protrusion of filler particles into the through hole (32a) can be suppressed. Further, since it is thought that the multiple filler particles are substantially uniformly dispersed in the insulating layer 21, even in the working example of FIG. 6A, it is thought that filler particles exposed in the through hole (32a) exist immediately after the formation of the through hole (32a). However, since the exposed filler particles have particle sizes as small as 1 μm or less, it is thought that adhering forces between the filler particles and the inner wall of the through hole (32a) are relatively small. Therefore, it is expected that the exposed filler particles are peeled off by the desmear treatment. In this way, by containing, in an insulating layer (especially in a region near a penetrating conductor to be formed), only filler particles having small particle sizes at or above a certain ratio with respect to a width of the penetrating conductor, it may be possible that protrusion of the filler particles into the penetrating conductor can be suppressed.

As in the example of FIG. 6B, problems that can occur when a filler particle 104 is exposed in the through hole 132 and as a result the filler particle protrudes into a penetrating conductor are described with reference to FIG. 7. FIG. 7 illustrates a penetrating conductor 131 formed in a through hole 132 that penetrates an insulating layer 121. Filler particles 104 protrude from an inner wall of the through hole 132 into the penetrating conductor 131.

Figure 7:
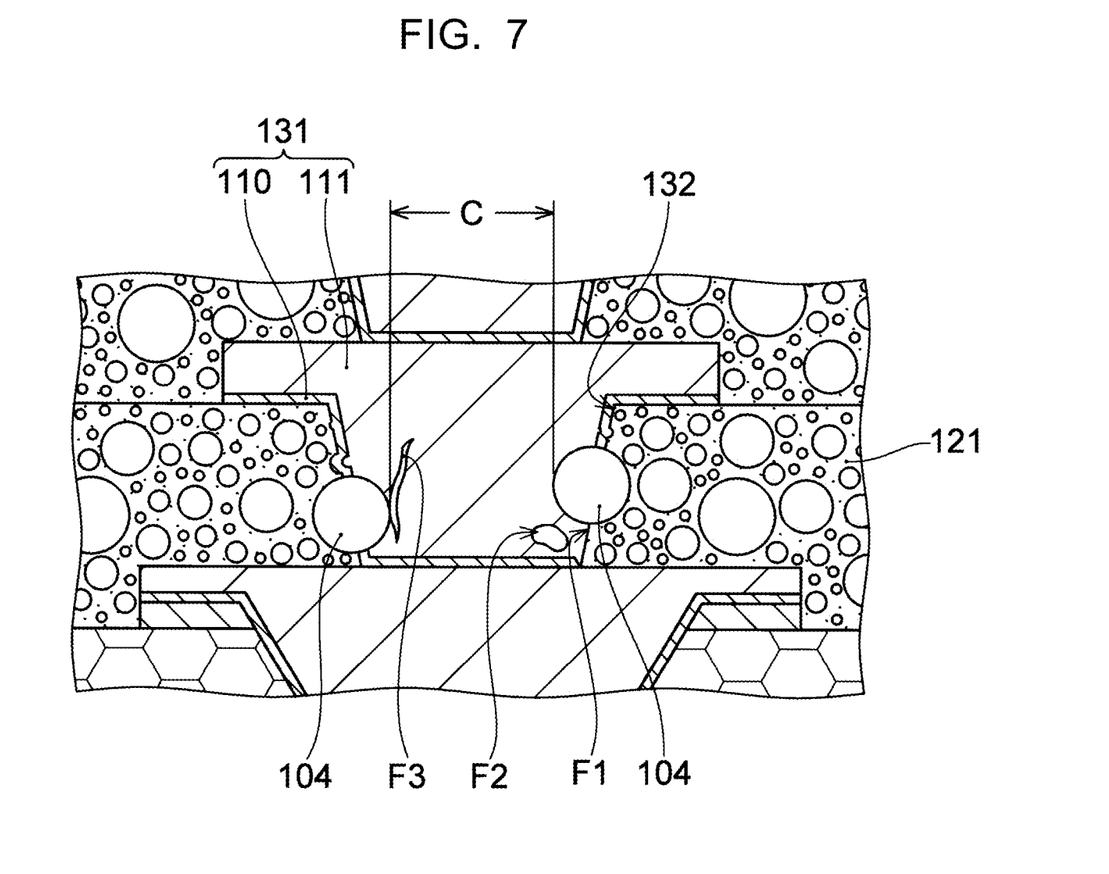
FIG. 7 is a cross-sectional view illustrating a problem that can occur in a conventional wiring substrate.

As illustrated in FIG. 7, when a filler particle 104 protrudes from the inner wall of the through hole 132, it may be difficult for a plating solution of electroless plating during formation of a metal film 110 to reach a lower side of the filler particle 104, and a deposition-failure portion (F1) of the metal film 110 may occur. Further, for example, also in formation of a plating film 111 by electrolytic plating, circularity of a plating solution on a lower side of a filler particle 104 may decrease and a void (F2) may be generated in the plating film 111.

Even after the formation of the penetrating conductor 131, a crack (F3) starting from a filler particle 104 may occur due to insufficient adhesion between the filler particle 104 and the plating film 111. Further, also when the wiring substrate is used, as illustrated by a conductive path width (C) in FIG. 7, since a substantially width of the penetrating conductor 131 in a direction intersecting an energization direction becomes narrower, electrical resistance of the penetrating conductor 131 may increase, and electrical characteristics of the wiring substrate may deteriorate.

According to the wiring substrate of the embodiment and the manufacturing method therefor described above, protrusion of filler particles into the through holes or the penetrating conductors is suppressed. Therefore, it is thought that the defects illustrated in FIG. 7 are suppressed, and as a result, problems such as deterioration in electrical characteristics of the penetrating conductors, and/or deterioration in adhesion strength between the penetrating conductors and the insulating layer, and the like are suppressed.

A wiring substrate according to an embodiment of the present invention is not limited to those having the structures illustrated in the drawings and those having the structures, shapes, and materials exemplified herein. As described above, a wiring substrate of an embodiment can have any laminated structure. For example, a wiring substrate of an embodiment may be a coreless substrate that does not include a core substrate. A wiring substrate of an embodiment can include any number of conductor layers and any number of insulating layers. In a wiring substrate of an embodiment, it is also possible that only some of the insulating layers contain multiple granular filler particles. An insulating layer containing multiple granular filler particles can exist at any layer in the laminated structure of a wiring substrate.

A method for manufacturing a wiring substrate according to an embodiment of the present invention is not limited the method described with reference to the drawings. For example, the conductor layers may be formed using a full additive method. Further, since filler particles having small particle sizes can also peel off from the inner walls of the through holes by free fall or the like, it is not always necessary to perform a desmear treatment. The through holes of the insulating layers may be formed using a method other than irradiation with laser. In a method for manufacturing a wiring substrate of an embodiment, it is also possible that any process other than the processes described above is added, or some of the processes described above are omitted.

In the wiring substrate described in International Publication No. 2014/157342, the inorganic insulating particles interposed between the first portion and the penetrating conductor are exposed on the inner wall of the through hole of the inorganic insulating layer and protrude from the inner wall to the penetrating conductor side. Therefore, electrical characteristics of the penetrating conductor or adhesion strength between the penetrating conductor and the inorganic insulating layer may be affected.

A wiring substrate according an embodiment of the present invention includes: an insulating layer containing multiple granular filler particles; an upper-layer conductor layer and a lower-layer conductor layer that oppose each other with the insulating layer sandwiched therebetween in a thickness direction of the insulating layer; and a penetrating conductor that penetrates the insulating layer and connects the upper-layer conductor layer and the lower-layer conductor layer to each other. The penetrating conductor has a first length as a maximum width along a direction orthogonal to the thickness direction, and the first length is 25 µm or less, and a maximum particle size of filler particles that are among the multiple filler particles and exist in a region within 40% of the first length from the penetrating conductor is 20% or less of the first length.

A method for manufacturing a wiring substrate according to one aspect of the present invention includes: forming an insulating layer containing multiple granular filler particles; forming two conductor layers opposing each other with the insulating layer sandwiched therebetween; and forming a penetrating conductor that penetrates the insulating layer and connects the two conductor layers to each other. The penetrating conductor is formed so as to have a maximum width of 25 µm or less along a direction orthogonal to a thickness direction of the insulating layer. The insulating layer is formed so as to have a region that does not contain filler particles having particle sizes exceeding 20% of the maximum width. The penetrating conductor is formed in the region.

According to an embodiment of the present invention, it may be possible to suppress deterioration in electrical characteristics of the penetrating conductor in the insulating layer and deterioration in adhesion strength between the penetrating conductor and the insulating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
an insulating layer comprising resin and filler particles;
a plurality of conductor layers including an upper-layer conductor layer and a lower-layer conductor layer such that the insulating layer is sandwiched between the upper-layer conductor layer and the lower-layer conductor layer; and
a penetrating conductor formed in the insulating layer such that the penetrating conductor is penetrating through the insulating layer and connecting the upper-layer conductor layer and the lower-layer conductor layer,
wherein the penetrating conductor is formed such that the penetrating conductor has a first length which is a maximum width of the penetrating conductor in a direction orthogonal to a thickness direction of the wiring substrate and that the first length is 25 inn or less, and the insulating layer is formed such that a maximum particle size of the filler particles in a region within a distance of 40% of the first length from the penetrating conductor is 20% or less of the first length and that the insulating layer does not have the filler particles exposed at an interface between the insulating layer and the penetrating conductor.

2. The wiring substrate according to claim 1, wherein the insulating layer is formed such that the insulating layer has a laser processed surface at the interface between the insulating layer and the penetrating conductor.

3. The wiring substrate according to claim 1, wherein the insulating layer is formed such that a maximum particle size of the filler particles in the insulating layer is 20% or less of the first length.

4. The wiring substrate according to claim 1, wherein the insulating layer is formed such that a volume content rate of the filler particles in the insulating layer is in a range of 30% to 80%.

5. The wiring substrate according to claim 1, wherein the penetrating conductor is formed such that the penetrating conductor has the maximum width at a first end in the thickness direction of the wiring substrate and has a second length which a width in the direction orthogonal to the thickness direction of the wiring substrate at a second end on an opposite side with respect to the first end, and the insulating layer is formed such that a maximum particle size of the filler particles in the insulating layer is 20% or less of the second length.

6. The wiring substrate according to claim 1, wherein one of the upper-layer conductor layer and the lower-layer conductor layer includes a conductor pad such that the conductor pad is integrally formed with the penetrating conductor, and the insulating layer is formed such that a maximum particle size of the filler particles in a region overlapping the conductor pad in a plan view is smaller than a distance from an outer edge of the conductor pad to an outer edge of the penetrating conductor in a plan view.

7. The wiring substrate according to claim 2, wherein the insulating layer is formed such that a maximum particle size of the filler particles in the insulating layer is 20% or less of the first length.

8. The wiring substrate according to claim 2, wherein the insulating layer is formed such that a volume content rate of the filler particles in the insulating layer is in a range of 30% to 80%.

9. The wiring substrate according to claim 2, wherein the penetrating conductor is formed such that the penetrating conductor has the maximum width at a first end in the thickness direction of the wiring substrate and has a second length which a width in the direction orthogonal to the thickness direction of the wiring substrate at a second end on an opposite side with respect to the first end, and the insulating layer is formed such that a maximum particle size of the filler particles in the insulating layer is 20% or less of the second length.

10. The wiring substrate according to claim 2, wherein one of the upper-layer conductor layer and the lower-layer conductor layer includes a conductor pad such that the conductor pad is integrally formed with the penetrating conductor, and the insulating layer is formed such that a maximum particle size of the filler particles in a region overlapping the conductor pad in a plan view is smaller than a distance from an outer edge of the conductor pad to an outer edge of the penetrating conductor in a plan view.

11. The wiring substrate according to claim 3, wherein the insulating layer is formed such that a volume content rate of the filler particles in the insulating layer is in a range of 30% to 80%.

12. The wiring substrate according to claim 3, wherein the penetrating conductor is formed such that the penetrating conductor has the maximum width at a first end in the thickness direction of the wiring substrate and has a second length which a width in the direction orthogonal to the thickness direction of the wiring substrate at a second end on an opposite side with respect to the first end, and the insulating layer is formed such that a maximum particle size of the filler particles in the insulating layer is 20% or less of the second length.

13. The wiring substrate according to claim 3, wherein one of the upper-layer conductor layer and the lower-layer conductor layer includes a conductor pad such that the conductor pad is integrally formed with the penetrating conductor, and the insulating layer is formed such that a maximum particle size of the filler particles in a region overlapping the conductor pad in a plan view is smaller than a distance from an outer edge of the conductor pad to an outer edge of the penetrating conductor in a plan view.

14. The wiring substrate according to claim 4, wherein the penetrating conductor is formed such that the penetrating conductor has the maximum width at a first end in the thickness direction of the wiring substrate and has a second length which a width in the direction orthogonal to the thickness direction of the wiring substrate at a second end on an opposite side with respect to the first end, and the insulating layer is formed such that a maximum particle size of the filler particles in the insulating layer is 20% or less of the second length.

15. The wiring substrate according to claim 4, wherein one of the upper-layer conductor layer and the lower-layer conductor layer includes a conductor pad such that the conductor pad is integrally formed with the penetrating conductor, and the insulating layer is formed such that a maximum particle size of the filler particles in a region overlapping the conductor pad in a plan view is smaller than a distance from an outer edge of the conductor pad to an outer edge of the penetrating conductor in a plan view.

16. The wiring substrate according to claim 5, wherein one of the upper-layer conductor layer and the lower-layer conductor layer includes a conductor pad such that the conductor pad is integrally formed with the penetrating conductor, and the insulating layer is formed such that a maximum particle size of the filler particles in a region overlapping the conductor pad in a plan view is smaller than a distance from an outer edge of the conductor pad to an outer edge of the penetrating conductor in a plan view.

17. The wiring substrate according to claim 7, wherein the insulating layer is formed such that a volume content rate of the filler particles in the insulating layer is in a range of 30% to 80%.

* * * * *